(12) United States Patent
Du

(10) Patent No.: US 9,437,622 B2
(45) Date of Patent: Sep. 6, 2016

(54) THIN FILM TRANSISTOR AND METHOD FOR MANUFACTURING THE SAME, ARRAY SUBSTRATE AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventor: Lei Du, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/355,058

(22) PCT Filed: Jun. 18, 2013

(86) PCT No.: PCT/CN2013/077406
§ 371 (c)(1),
(2) Date: Apr. 29, 2014

(87) PCT Pub. No.: WO2014/153853
PCT Pub. Date: Oct. 2, 2014

(65) Prior Publication Data
US 2015/0279869 A1     Oct. 1, 2015

(30) Foreign Application Priority Data
Mar. 25, 2013 (CN) .......................... 2013 1 0098005

(51) Int. Cl.
*H01L 29/10* (2006.01)
*H01L 29/12* (2006.01)
(Continued)

(52) U.S. Cl.
CPC ....... *H01L 27/1248* (2013.01); *H01L 27/1262* (2013.01); *H01L 29/66969* (2013.01); *H01L 29/7869* (2013.01)

(58) Field of Classification Search
USPC .............. 257/368, 392, 66, 72, 252–254, 257/257–258, 43, 57, 59, 83, 290, 351; 438/22, 24, 48, 30, 128, 149, 151, 157, 438/161, 283
See application file for complete search history.

(56) References Cited

U.S. PATENT DOCUMENTS

2007/0194386 A1    8/2007  Hahn et al.
2010/0025677 A1*   2/2010  Yamazaki ........... H01L 27/1225
                                              257/43
(Continued)

FOREIGN PATENT DOCUMENTS

CN         101814529 A        8/2010
CN          10269054    *     8/2012
(Continued)

OTHER PUBLICATIONS

International Preliminary Report on Patentability Appln. No. PCT/CN2013/077406; Dated Sep. 29, 2015.
Third Chinese Office Action Appln. No. 201310098005.8; Dated Sep. 28, 2015.
(Continued)

*Primary Examiner* — Dao H Nguyen
*Assistant Examiner* — Tram H Nguyen
(74) *Attorney, Agent, or Firm* — Ladas & Parry LLP

(57) ABSTRACT

A thin film transistor and a method for manufacturing the same, an array substrate and a display device that can prevent the semiconductor layer in a channel region from damage. The thin film transistor includes a gate electrode, a gate insulating layer, a semiconductor layer, an insulator layer, and source/drain electrodes, the insulator layer is provided on the semiconductor layer, covers channel regions of the source/drain electrodes, and is formed of a metal oxide insulator. In this thin film transistor, when water vapor from the air penetrates, the insulator layer formed of the metal oxide insulator will firstly reacts with the water vapor to prevent the metal oxide semiconductor in the channel region from damage.

16 Claims, 3 Drawing Sheets

(51) Int. Cl.
    *H01L 27/12*   (2006.01)
    *H01L 29/786*  (2006.01)
    *H01L 29/66*   (2006.01)

(56) References Cited

U.S. PATENT DOCUMENTS

| | | | |
|---|---|---|---|
| 2010/0213460 A1* | 8/2010 | Kondo | H01L 29/78693 257/43 |
| 2013/0278855 A1* | 10/2013 | Uemura | H01L 29/78606 349/46 |
| 2014/0103334 A1 | 4/2014 | Xie et al. | |

FOREIGN PATENT DOCUMENTS

| | | |
|---|---|---|
| CN | 102629054 A | 8/2012 |
| CN | 202443973 U | 9/2012 |
| CN | 203134811 A | 8/2013 |

OTHER PUBLICATIONS

First Chinese Office Action dated Feb. 28, 2015; Appln. No. 201310098005.8.

International Search Report mailed Feb. 1, 2014; PCT/CN2013/077406.

Second Chinese Office Action dated Jun. 18, 2015; Appln. No. 20130098005.8.

* cited by examiner

THIN FILM TRANSISTOR AND METHOD FOR MANUFACTURING THE SAME, ARRAY SUBSTRATE AND DISPLAY DEVICE

TECHNICAL FIELD

Embodiments of the present invention relates to a thin film transistor, a method for manufacturing the same, an array substrate and a display device.

BACKGROUND

In recent years, thin film transistor liquid crystal displays (TFT-LCDs) have been more and more widely used. In the meantime, the technology for thin film transistors to drive and control pixels has accordingly obtained development, and has developed from previous amorphous silicon thin film transistors to current low temperature poly-silicon thin film transistors, oxide thin film transistors, and so on.

Oxide thin film transistors have better characteristics, such as electron mobility, on-state current, switching characteristic and so on, than amorphous thin film transistors. Because of better uniformity, oxide thin film transistors have advantages in the number of masks and manufacturing difficulties, have less difficulties in manufacturing large-sized display devices, and are enough for an application for which a fast response and a larger current are required. Therefore, oxide thin film transistors are increasingly getting attention.

FIG. 1 is a schematic configuration drawing of the conventional oxide thin film transistor, and as illustrated, the current oxide thin film transistor comprises a substrate 1, a gate electrode 2, a gate insulating layer 3, a semiconductor layer 4, an etching stopping layer 5 and source/drain electrodes 7. In manufacturing an oxide thin film transistor, generally on the substrate 1, the processes of film-forming, exposing, developing, and etching are successively performed for a gate metal layer, a gate insulating layer, a metal oxide semiconductor layer, an etching stopping layer and a data line metal layer, so as to successively form the gate electrode 2, the gate insulating layer 3, the semiconductor layer 4, the etching stopping layer 5, and the source/drain electrodes 7.

The etching stopping layer 5 is usually of a multilayer film structure that is formed of one or more of silicon oxide (SiOx), silicon nitride (SiNx) and silicon oxynitride (SiON), thus has poor water resistance property and is prone to be penetrated by water vapor from the air in the subsequent manufacturing process of the product and in use, then making the semiconductor layer in the channel region below the etching stopping layer be subjected to damage and causing the product failure.

SUMMARY

An embodiment of the invention provides a thin film transistor, comprising a gate electrode, a gate insulating layer, a semiconductor layer, an insulator layer and source/drain electrodes, wherein the insulator layer is provided on the semiconductor layer, covers a channel region between the source/drain electrodes, and is formed of a metal oxide insulator.

Another embodiment of the invention provides a method for manufacturing a thin film transistor, comprising: forming a gate electrode on a substrate, and forming a gate insulating layer on the gate electrode; forming a semiconductor layer, and forming a metal oxide insulator layer on the semiconductor layer; and forming source/drain electrodes, wherein the metal oxide insulator layer covers a channel region between the source/drain electrodes.

A further embodiment of the invention provides an array substrate, comprising the abovementioned thin film transistor.

A still further embodiment of the invention provides a display device, comprising the abovementioned array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

An embodiment of the invention provides a thin film transistor, in which an insulator layer that is formed of a metal oxide insulator is provided on a semiconductor layer, and the insulator layer is capable of reacting with water vapor, thus capable of preventing the metal oxide in a channel region from damage. Embodiments of the invention further provide a method for manufacturing the abovementioned thin film transistor and provided an array substrate and a display device that both include the thin film transistor.

With reference to accompanying drawings, the thin film transistor and the method for manufacturing the same in the embodiments of the invention will be described in detail in the following, and the following embodiments are merely exemplary and are not limitative.

Figure 1:
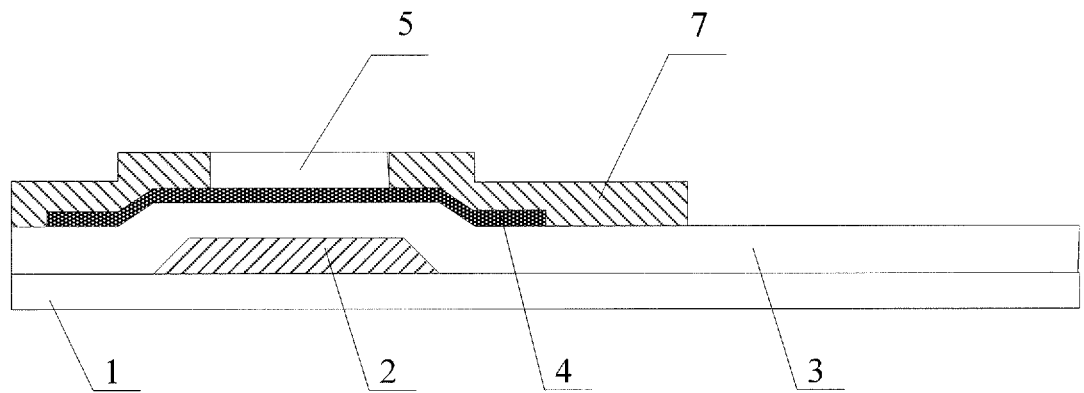
FIG. 1 is a schematic cross-sectional drawing of a current thin film transistor.
Figure 2:
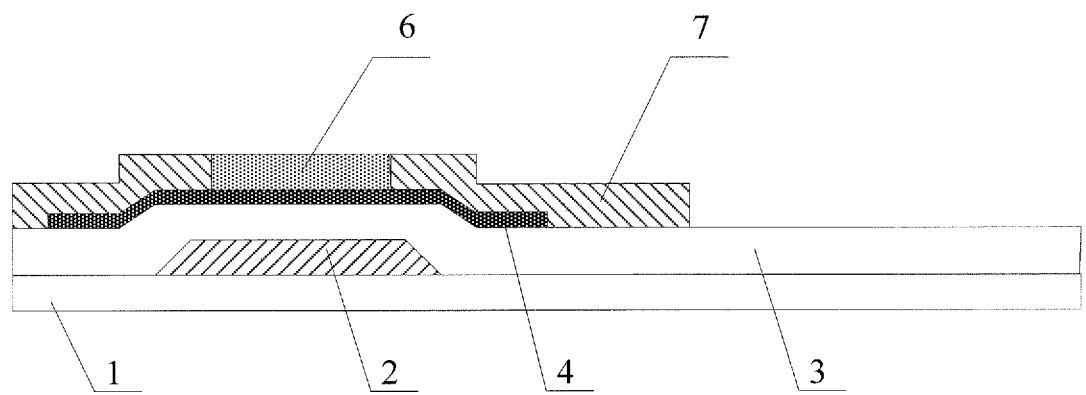
FIG. 2 is a schematic cross-sectional drawing of an example of the thin film transistor provided by an embodiment of the invention.

A first embodiment of the invention provides a thin film transistor, as illustrated in FIG. 2, the thin film transistor comprising: a substrate 1, a gate electrode 2, a gate insulating layer 3, a semiconductor layer 4, an insulator layer 6 and source/drain electrodes 7. The gate electrode 2 is formed on the substrate 1, the gate insulating layer 3 is formed on the gate electrode 2, the semiconductor layer 4 is formed on the gate insulating layer 3, and the insulator layer 6, which covers the channel region between the source/drain electrodes and is formed of a metal oxide insulator, is formed on the semiconductor layer 4. Because the insulator layer 6 is formed of a metal oxide, it can react with the water vapor penetrating it, thus preventing the semiconductor layer 4 below it from damage. The source/drain electrodes 7 are further provided on the semiconductor layer 4.

Figure 3:
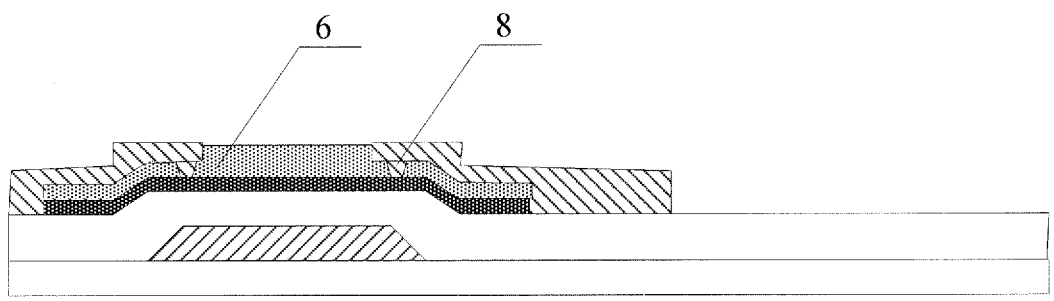
FIG. 3 is a schematic cross-sectional drawing of another example of the thin film transistor provided by the embodiment of the invention.

In the embodiment of the invention, the position of the insulator layer 6 provided on the semiconductor layer 4 may be selected flexibly. In some embodiments of the invention, because there will be water vapor penetration only in the channel region between the source/drain electrodes 7 during operation, the insulator layer 6 may be provided only at the position corresponding to the channel region between the source/drain electrodes 7, so as to save the metal oxide insulator material, that is to say, the insulator layer 6 and the source/drain electrodes 7 have no overlapping regions, with reference to FIG. 2 again. In some embodiments of the invention, the insulator layer may be provided in an entire layer on the semiconductor layer 4, so as to simplify the manufacturing process and to reduce difficulties in etching, and at this time, in order to realize ohmic contact between the semiconductor layer 4 and the source/drain electrodes 7, via holes 8 that electrically connect the semiconductor layer 4 with the source/drain electrodes 7 may be provided in the overlapping regions of the insulator layer 6 with the source/drain electrodes 7, as illustrated in FIG. 3.

In the embodiment of the invention, in order to simplify the process, the insulator layer 6 and the semiconductor layer 4 may be made of a same kind of metal oxide but are of materials with different properties by controlling the percentage of oxygen in the metal oxide, for example, the percentage of oxygen in the metal oxide forming the insulator layer 6 is elected to be higher than that in the metal oxide forming the semiconductor layer 4, and the atom percentage of oxygen in the metal oxide is controlled to be in a range of 60%~90% to form an insulator, and then to form the insulator layer 6. In the embodiment of the invention, for example, the insulator layer 6 and the semiconductor layer 4 employ a same metal oxide, after the metal oxide insulator reacts with water vapor, the insulator layer 6 can be converted to a semiconductor, thus it not only has a function of an etching stopping layer, but also plays the role of a semiconductor layer after being converted to a semiconductor when water vapor penetration occurs.

In the thin film transistor provided by the embodiment of the invention, an insulator layer that is formed of a metal oxide insulator is provided on the semiconductor layer. If water vapor from the air penetrates, the insulator layer formed of the metal oxide insulator will firstly reacts with the water vapor and then is converted into a semiconductor to protect the metal oxide semiconductor in the channel region; also, the metal oxide insulator may be employed to replace the etching stopping layer, thus the manufacture of the etching stopping layer can be saved, and further the manufacturing process can be simplified.

Figure 4:
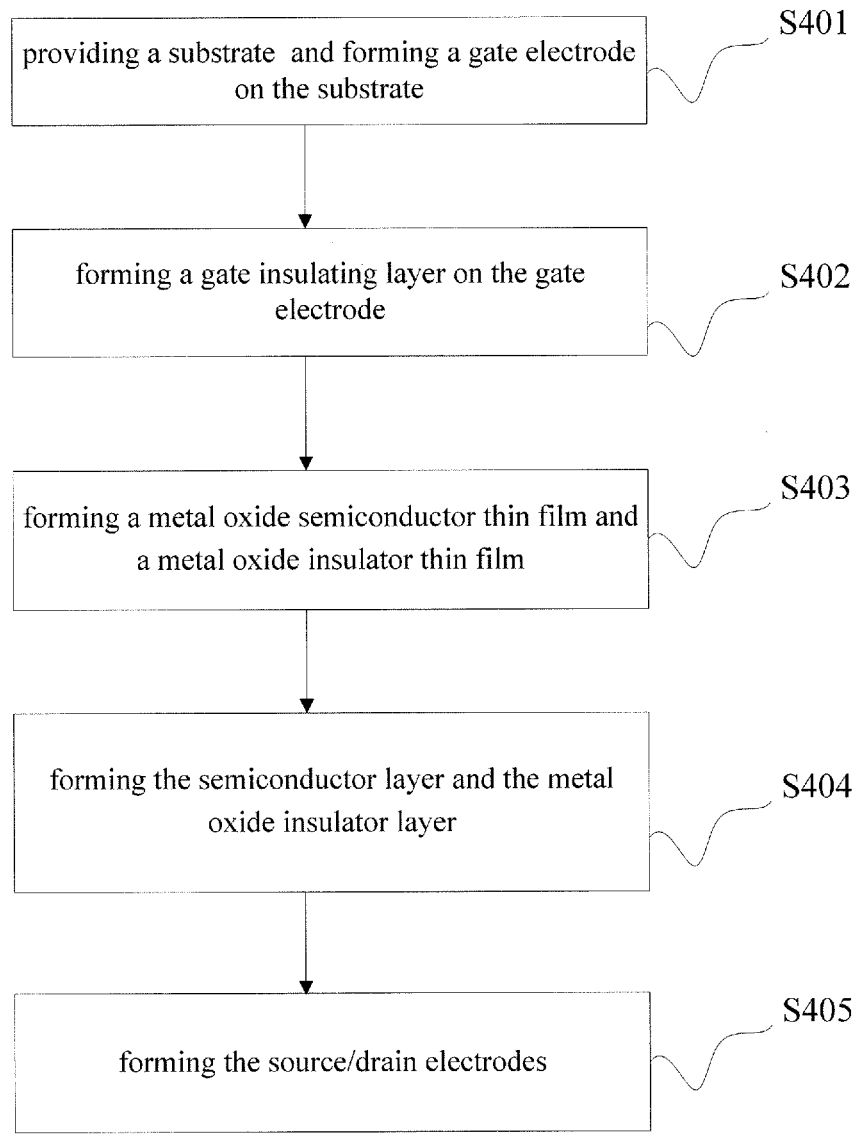
FIG. 4 is a flow chart of a method for manufacturing the thin film transistor provided by the embodiments of the invention.

There is provided a method for manufacturing a thin film transistor in a second embodiment of the invention, and the process of the manufacturing method as illustrated in FIG. 4, for example, mainly comprises the following steps.

S401: providing a substrate 1 and forming a gate electrode 2 on the substrate 1.

In S401, the abovementioned substrate 1 may be a substrate based on an inorganic material such as a glass substrate and a quartz substrate, and also may be a substrate using an organic material.

In the embodiment of the invention, the material of the gate electrode layer that forms the gate electrode 2 may be selected from a single layer film or a multilayer composite film that is formed of one or more of molybdenum (Mo), molybdenum niobium alloy (MoNb), aluminum (Al), aluminum neodymium alloy (AlNd), titanium, and copper (Cu), for example, a single layer film or a multilayer composite film that is formed of Mo, Al, or an alloy containing Mo and Al, with a film thickness of 100 nm~500 nm.

S402: forming a gate insulating layer 3 on the gate electrode 2.

In the embodiment of the invention, the gate insulating layer 3 may be formed by a single layer film or a multilayer composite film that is formed of one or two of silicon oxide (SiOx), silicon nitride (SiNx), hafnium oxide (HfOx), silicon oxynitride (SiON) and aluminum oxide (AlOx).

S403: forming a metal oxide semiconductor thin film and a metal oxide insulator thin film.

In the embodiment of the invention, the metal oxide semiconductor thin film and the metal oxide insulator thin film may comprise two or more elements of In (indium), Ga (gallium), Zn (zinc), Sn (tin) and Al (aluminum), in addition to O (oxygen) element, for example, may be IGZO (indium gallium zinc oxide), IZO (indium zinc oxide), InSnO (indium tin oxide), InGaSnO (indium gallium tin oxide), and so on. Certainly, it is needed that the percentage of oxygen in the metal oxide insulator is higher than that in the metal oxide semiconductor.

In the embodiment of the invention, the metal oxide semiconductor thin film and the metal oxide insulator thin film may be formed in a way of depositing, spin coating, spray coating, and so on, but the embodiment of the invention is not limited thereto. For example, in the embodiment of the invention, a magnetron sputtering film-forming method may be employed without an annealing process, so as to prevent the subsequent annealing process from affecting the properties of the metal oxide.

In the embodiment of the invention, the metal oxide semiconductor thin film and the metal oxide insulator thin film may employ a same metal oxide, and may also employ different metal oxides, but the embodiment of the invention is not limited thereto. For example, in the embodiment of the invention, the metal oxide insulator thin film and the metal oxide semiconductor thin film employ a same metal oxide material, and in this way the required metal oxide semiconductor thin film and metal oxide insulator thin film are formed successively by controlling the film-forming atmosphere and using a same kind of target.

In the embodiment of the invention, a layer of metal oxide thin film is deposited in advance for forming the metal oxide semiconductor layer, then reactant gases mixed with oxygen gas ($O_2$) are introduced to successively form the metal oxide semiconductor thin film and the metal oxide insulator thin film that include a same metal oxide, by controlling the ratio of $O_2$ in the reactant gases.

It is to be noted that the embodiment of the invention is illustrated with reference to the example of using a depositing method to form a metal oxide thin film for forming the metal oxide semiconductor layer, but the embodiment of the invention is not limited thereto.

In the embodiment of the invention, the reactant gases that form the metal oxide semiconductor and the metal oxide insulator are generally mixed gases containing $O_2$. By controlling the ratio of $O_2$ in the reactant gases, the metal oxide semiconductor thin film and the metal oxide insulator thin film that include a same metal oxide are formed successively; in forming the metal oxide semiconductor thin film, the volume ratio of $O_2$ in the reactant gases may be 10%~40%; in forming the metal oxide insulator thin film, the volume ratio of $O_2$ in the reactant gases may be 60%~90%, and for example, in forming the metal oxide insulator thin film, the volume ratio of $O_2$ in the reactant gases may be 80%~90%. Certainly, in forming the metal oxide semiconductor and the metal oxide insulator, in addition to control to $O_2$, the specific film-forming atmosphere may be changed as the ratio of $O_2$ in the reactant gas changes. For example, in forming the metal oxide semiconductor thin film, the film-forming temperature is T1 (for example, T1=25° C.~100° C.), the pressure is P1 (for example, P1=0.5 pa-1 pa); in forming the metal oxide insulator thin film, the film-forming temperature is T2 (for example, T2=25° C.~100° C.), and the pressure is P2 (for example, P2=4 pa-6 pa).

The embodiment of the invention is illustrated with reference to the example in which the reactant gases that form the metal oxide are gases mixed with $O_2$ (oxygen gas) and Ar (Argon gas), but of course the invention not limited thereto, and for example, the reactant gases may also be gases mixed with $O_2$ (oxygen) and $N_2$ (nitrogen).

In the embodiment of the invention, the metal oxide semiconductor thin film and the metal oxide insulator thin film that include a same metal oxide can successively formed by controlling the ratio of $O_2$ in the reactant gases and in different film-forming atmospheres. For example, the thickness of the metal oxide semiconductor thin film is 50 nm~100 nm, the film-forming atmosphere is of the mixed gas of $O_2$ and Ar, the volume ratio of $O_2$ in the mixed gas of $O_2$ and Ar is 10%-40%, the film-forming temperature is 25° C.~100° C., the pressure is 0.5 pa-1 pa, and the specific film-forming atmosphere may change as the flow rate of $O_2$/Ar changes.

For example, the thickness of the metal oxide insulator thin film is 10 nm-50 nm, the film-forming atmosphere is still of a mixed gas of $O_2$ and Ar, the volume ratio of $O_2$ in the mixed gas of $O_2$ and Ar is 60%-90%, the film-forming temperature is 25° C.~100° C., the pressure is 4 pa-6 pa, and the specific film-forming atmosphere may change as the flow rate of $O_2$/Ar changes.

In the embodiment of the invention, in order to form a metal oxide insulator layer with better water resistance property, for example, the volume ratio of $O_2$ in the mixed gas of $O_2$ and Ar is 80%-90%.

S404: forming the semiconductor layer 4 and the metal oxide insulator layer 6.

In the embodiment of the invention, the semiconductor layer 4 and the metal oxide insulator layer 6 may be formed respectively by using different patterning processes, and also may be formed simultaneously by using a same patterning process.

In the embodiment of the invention, a patterning process may include part or all of procedures for forming a pattern, such as masking, exposing, developing, photoetching, etching, and so on.

For example, the patterning process used to form a gate electrode on a substrate comprises: firstly depositing a gate electrode thin film on the substrate; then coating photoresist and using a mask to perform an exposure and a development process to the photoresist to form a photoresist pattern; next, employing the photoresist pattern as an etching mask to remove the corresponding gate electrode thin film by a process such as etching and remove the rest photoresist; finally, forming a gate electrode pattern on the substrate.

In the embodiment of the invention, when the semiconductor layer 4 and the insulator layer 6 are formed respectively by using different patterning processes, the procedure of forming the semiconductor layer 4 is the same as the procedure of forming a semiconductor layer in the conventional method for manufacturing a thin film transistor, so detailed description thereto is omitted here.

In the embodiment of the invention, when the semiconductor layer 4 and the insulator layer 6 are formed respectively by using different patterning processes, different metal oxide insulator layers may be formed according to need.

In order to save the metal oxide insulator material, the metal oxide insulator thin film for forming the metal oxide insulator layer 6 may be exposed, developed and etched by using a mask process, to form an insulator layer in the corresponding position for forming the channel region between source/drain electrodes, that is, the metal oxide insulator thin film and the source/drain electrodes to be formed have no overlapping regions therebetween.

In order to simplify the mask process, there may be provided the metal oxide insulator layer 6 on the entire semiconductor layer 4, that is, the metal oxide insulator thin film for forming the metal oxide insulator layer may be exposed, developed and etched by using a mask process, to form an insulator layer having overlapping regions with the source/drain electrodes to be formed; where the insulator layer has overlapping regions with the source/drain electrodes to be formed, and a via hole process may performed on the insulator layer to form via holes that electrically connect source/drain electrodes to be formed with the semiconductor layer in the overlapping regions, to realize ohmic contact between the semiconductor layer and the source/drain electrodes to be formed with the via holes.

In the embodiment of the invention, the semiconductor layer 4 and the metal oxide insulator layer 6 may be both formed by using one patterning process.

In the embodiment of the invention, when the metal oxide insulator layer 6 is disposed on the entire semiconductor layer 4, and an insulator layer having overlapping regions with the source/drain electrodes to be formed is formed, for example, the metal oxide semiconductor thin film and the metal oxide insulator thin film can be formed by controlling the ratio of $O_2$ in the reactant gases in step S403, and furthermore, the semiconductor layer 4 and the metal oxide insulator layer 6, for example, may be both formed by using one patterning process to simplify process procedures and reduce process costs.

S405: depositing a metal thin film for the source/drain electrodes, and performing a patterning process to form the source/drain electrodes 7.

In the embodiment of the invention, the material of the metal thin film for the source/drain electrodes may be a single layer film or a multilayer composite film that is formed of one or more of Mo, MoNb, Al, AlNd, Ti and Cu, for example, a single layer film or a multilayer composite film formed of Mo and Al or an alloy containing Mo and Al.

In the method for manufacturing a thin film transistor provided by the embodiment of the invention, an insulator layer that is formed of a metal oxide insulator is formed on a semiconductor layer, and when water vapor from the air penetrates therethrough, the insulator layer formed of the metal oxide insulator will firstly reacts with the water vapor and then is converted into a semiconductor, thus the metal oxide semiconductor in a channel region can be prevented from damage; furthermore, in the embodiment of the invention, both the insulator layer and the semiconductor layer are formed of a metal oxide, so similar processes for etching, developing and so on may be employed without manufacturing an etching stopping layer separately, thus the manufacturing process is simplified.

A third embodiment of the invention further provides an array substrate, the array substrate comprises the thin film transistor provided by the first embodiment of the invention, and other configurations of the array substrate may be the same with the conventional technology, so detailed description thereto is omitted here.

A fourth embodiment of the invention further provides a display device, the display device comprises the array substrate provided by the third embodiment of the invention, and other configurations of the display device may be the same with the current technology, so detailed description thereto is omitted here.

The above embodiments are only used to illustrate the technical solutions of the invention rather than limitations; although the invention has been illustrated in detail with reference to the above embodiments, those skilled in the art should understand that the technical solutions recited in each of the above embodiments can be still modified, or part of the technical features may be varied equivalently; but these modifications or variations do not make the substance of the corresponding technical solutions go beyond of the spirit and scope of the technical solution of each embodiment of the invention.

The invention claimed is:

1. A thin film transistor, comprising: a substrate, a gate electrode, a gate insulating layer, a semiconductor layer, an insulator layer, and source/drain electrodes, wherein the insulator layer is provided on the semiconductor layer, covers a channel region between the source/drain electrodes, and is formed of a metal oxide insulator;
the insulator layer and the source/drain electrodes have overlapping regions, and via holes that electrically connect the source/drain electrodes and the semiconductor layer are provided in the overlapping regions;
the semiconductor layer and the insulator layer have a same size along a direction parallel to the substrate.

2. The thin film transistor as claimed in claim 1, wherein the insulator layer comprises a same metal oxide as the semiconductor layer, and an atom percentage of oxygen element in the metal oxide in the insulator layer is 60%~90%.

3. The thin film transistor as claimed in claim 1, wherein the insulator layer comprises a metal oxide that is different from the semiconductor layer.

4. A method for manufacturing a thin film transistor, comprising:
forming a gate electrode on a substrate, and forming a gate insulating layer on the gate electrode;
forming a semiconductor layer, and forming a metal oxide insulator layer on the semiconductor layer; and
forming source/drain electrodes;
wherein the metal oxide insulator layer covers a channel region between the source/drain electrodes;
wherein forming of the metal oxide insulator layer comprises:
performing exposing, developing and etching onto a metal oxide insulator thin film for forming the metal oxide insulator layer to form an insulator layer that has overlapping regions with the source/drain electrodes to be formed; and
performing a via hole process on the insulator layer to form via holes that electrically connect the source/drain electrodes with the semiconductor layer in the overlapping regions in the metal oxide insulator layer;
the semiconductor layer and the insulator layer have a same size along a direction parallel to the substrate.

5. The method as claimed in claim 4, wherein forming of the semiconductor layer and forming the metal oxide insulator layer on the semiconductor layer comprises:
depositing a metal oxide thin film for forming a metal oxide semiconductor layer;
introducing reactant gases mixed with oxygen $O_2$;
controlling a volume ratio of $O_2$ in the reactant gases, and successively forming a metal oxide semiconductor thin film and a metal oxide insulator thin film that include a same metal oxide; wherein in forming the metal oxide semiconductor thin film, the volume ratio of $O_2$ in the reactant gases is 10%-40%; in forming the metal oxide insulator thin film, the volume ratio of $O_2$ in the reactant gases is 60%-90%.

6. The method as claimed in claim 5, wherein the semiconductor layer and the metal oxide insulator layer on the semiconductor layer are both formed by using one patterning process on the metal oxide semiconductor thin film and the metal oxide insulator thin film.

7. The method as claimed in claim 5, wherein in forming the metal oxide insulator thin film, the volume ratio of 02 in the reactant gas is 80%-90%.

8. The method as claimed in claim 4, wherein the semiconductor layer and the metal oxide insulator layer are successively formed by employing a magnetron sputtering film-forming method.

9. An array substrate, comprising the thin film transistor as claimed in claim 1.

10. A display device, comprising the array substrate as claimed in claim 9.

11. The thin film transistor as claimed in claim 1, wherein the insulator layer comprises a same metal oxide as the semiconductor layer, and an atom percentage of oxygen element in the metal oxide in the insulator layer is 60%~90%.

12. The thin film transistor as claimed in claim 1, wherein the insulator layer comprises a metal oxide that is different from the semiconductor layer.

13. The thin film transistor as claimed in claim 1, wherein the insulator layer comprises a same metal oxide as the semiconductor layer, and an atom percentage of oxygen element in the metal oxide in the insulator layer is 60%~90%.

14. The thin film transistor as claimed in claim 1, wherein the insulator layer comprises a metal oxide that is different from the semiconductor layer.

15. The method as claimed in claim 4, wherein the semiconductor layer and the metal oxide insulator layer are successively formed by employing an magnetron sputtering film-forming method.

16. The method as claimed in claim 4, wherein the semiconductor layer and the metal oxide insulator layer are successively formed by employing an magnetron sputtering film-forming method.

* * * * *

UNITED STATES PATENT AND TRADEMARK OFFICE
CERTIFICATE OF CORRECTION

PATENT NO.       : 9,437,622 B2                                       Page 1 of 1
APPLICATION NO.  : 14/355058
DATED            : September 6, 2016
INVENTOR(S)      : Du It is certified that error appears in the above-identified patent and that said Letters Patent is hereby corrected as shown below:

In the Claims

Column 8, Line 3 Claim 7 - delete "02" and insert -- $O_2$ --

Signed and Sealed this
Sixteenth Day of May, 2017

Michelle K. Lee
*Director of the United States Patent and Trademark Office*